US009946021B1

(12) United States Patent
Chiu et al.

(10) Patent No.: US 9,946,021 B1
(45) Date of Patent: Apr. 17, 2018

(54) METHOD FOR FABRICATING WAVEGUIDE CONSTRUCTION

(71) Applicant: National Sun Yat-sen University, Kaohsiung (TW)

(72) Inventors: Yi-Jen Chiu, Kaohsiung (TW); Po-Yun Wang, Kaohsiung (TW); Wei Lin, Tainan (TW); Yang-Jeng Chen, Kaohsiung (TW)

(73) Assignee: NATIONAL SUN YAT-SEN UNIVERSITY, Kaohsiung (TW)

( * ) Notice: Subject to any disclaimer, the term of this patent is extended or adjusted under 35 U.S.C. 154(b) by 0 days.

(21) Appl. No.: 15/642,354

(22) Filed: Jul. 6, 2017

(30) Foreign Application Priority Data

Mar. 23, 2017 (TW) .................................. 106109813

(51) Int. Cl.
*H01L 21/00* (2006.01)
*G02B 6/13* (2006.01)
*G02B 6/122* (2006.01)
*G02B 6/12* (2006.01)

(52) U.S. Cl.
CPC ............. *G02B 6/13* (2013.01); *G02B 6/122* (2013.01); *G02B 2006/12038* (2013.01)

(58) Field of Classification Search
CPC .................................. G02B 6/13; G02B 6/122
USPC ......................................................... 438/31
See application file for complete search history.

(56) References Cited

U.S. PATENT DOCUMENTS

| 7,440,180 B2 | 10/2008 | Tang |
| 7,736,933 B2 | 6/2010 | Arai et al. |
| 7,972,943 B2 | 7/2011 | Moriwaka |
| 2007/0246701 A1* | 10/2007 | Yanson ................. H01L 21/182 257/15 |
| 2017/0317468 A1 | 11/2017 | Feitisch et al. |

FOREIGN PATENT DOCUMENTS

| CN | 101738748 A | * 6/2010 |
| CN | 102946051 A | 2/2013 |
| CN | 103545715 B | 1/2016 |

(Continued)

OTHER PUBLICATIONS

Using Quantum well intermixing for Electroabsorption Modulators with Optical and Electric Confinement Waveguide.

*Primary Examiner* — David S Blum
(74) *Attorney, Agent, or Firm* — Mark M. Friedman

(57) ABSTRACT

A method for fabricating a waveguide construction is described and has steps of: providing a layered structure by: forming a first-type InGaAsP layer on a substrate, forming a first-type InP layer on the first-type InGaAsP layer, forming an active layer containing gallium on the first-type InP layer, forming a second-type InP layer on the active layer, and forming a second-type InGaAsP layer on the second-type InP layer; forming an $SiO_2$ patterned layer having $SiO_2$ regions and at least one channel facing toward a desired direction and formed between the $SiO_2$ regions on the second-type InGaAsP layer; and performing a rapid thermal annealing treatment on the layered structure formed with the $SiO_2$ patterned layer. The rapid thermal annealing treatment has a treating temperature between 720° C. and 760° C. and a treating time between 60 and 240 seconds.

18 Claims, 7 Drawing Sheets

(56) References Cited

FOREIGN PATENT DOCUMENTS

| TW | I361294 B | 4/2012 |
|----|-----------|--------|
| TW | I390752 B | 3/2013 |
| TW | I413192 B | 10/2013 |
| TW | 201417426 A | 5/2014 |

* cited by examiner

METHOD FOR FABRICATING WAVEGUIDE CONSTRUCTION

CROSS REFERENCE TO RELATED APPLICATION

This application claims priority to Taiwan Patent Application No. 106109813, filed Mar. 23, 2017, titled "METHOD FOR FABRICATING WAVEGUIDE CONSTRUCTION". This invention is partly disclosed in a thesis entitled "Using Quantum well intermixing for Electroabsorption Modulators with Optical and Electric Confinement Waveguide" on Sep. 26, 2016 completed by Po-Yun Wang and Yi-Jen Chiu.

FIELD OF THE DISCLOSURE

The present disclosure relates to a method for fabricating a semiconductor construction, and more particularly to a method for fabricating a waveguide construction.

BACKGROUND OF THE DISCLOSURE

A waveguide construction is mainly used to limit a pathway of transmitting a wave, so as to transmit the wave far away. In a conventional waveguide construction, a guiding channel is mainly formed by two materials with different refractive indices, so as to limit the wave in the guiding channel. Specifically speaking, a material with a high refractive index would be disposed between the materials with a low refractive index, such that the wave can produce a total reflection in the material with a high reflective index and continuously travel in the guiding channel However, this kind of waveguide construction requires multiple procedures during production. This is because an active layer needs to be etched for forming this kind of construction based on minimizing the waveguide construction (such as a size ranged from several microns to several tens of microns, or from several nanometers to several hundreds of nanometers). However, a bad electrical property could be induced by the etched active layer. For example, an electron would suffer a relatively high energy baffler or a short circuit could be induced in an interface between the etched active layer (used as the material with high refractive index) and another material (used as the material with low refractive index), due to a difference between the materials of the etched active layer and the other material. Further, a relatively high fabricating cost and a relatively high fabricating time are used.

As a result, it is necessary to provide a waveguide construction to solve the problems existing in the conventional technologies, as described above.

SUMMARY OF THE DISCLOSURE

A primary object of the present disclosure is to provide a method for fabricating a waveguide construction, in which an active layer with a guiding channel is fabricated without using an etching method, so as to enable the active layer of the waveguide construction to have an intact structure. Further, a relatively low fabricating cost and a relatively low fabricating time are used.

A secondary object of the present disclosure is to provide a method for fabricating a waveguide construction, which the active layer with the guiding channel is fabricated by using a quantum well intermixing (QWI) method, so as to enable the active layer of the waveguide construction having an intact structure. Further, a relatively low fabricating cost and a relatively low fabricating time are used.

To achieve the above object, the present disclosure provides a method for fabricating a waveguide construction, comprising steps of: providing a layered structure by: forming a first-type InGaAsP layer on a substrate; forming a first-type InP layer on the first-type InGaAsP layer; forming an active layer containing gallium on the first-type InP layer; forming a second-type InP layer on the active layer; and forming a second-type InGaAsP layer on the second-type InP layer; forming an $SiO_2$ patterned layer on the second-type InGaAsP layer, wherein the $SiO_2$ patterned layer comprises a plurality of $SiO_2$ regions, and at least one channel facing toward a desired direction is formed between the $SiO_2$ regions; and performing a rapid thermal annealing treatment on the layered structure having the $SiO_2$ patterned layer, wherein the rapid thermal annealing treatment has a treating temperature ranged from 720° C. to 760° C. and a treating time ranged from 60 seconds to 240 seconds.

In one embodiment of the present disclosure, the channel is linear.

In one embodiment of the present disclosure, an inner width of the channel is between 3 and 7 um.

In one embodiment of the present disclosure, the rapid thermal annealing treatment has the treating temperature of 740° C., and the treating time ranged from 90 seconds to 180 seconds.

In one embodiment of the present disclosure, a number of the channels is equal to or greater than two, and all of the channels are towards the desired direction.

In one embodiment of the present disclosure, the first-type InGaAsP layer is an N-type InGaAsP layer, the first-type InP layer is an N-type InP layer, the second-type InP layer is a P-type InP layer, and the second-type InGaAsP layer is a P-type InGaAsP layer.

In one embodiment of the present disclosure, the active layer is a multiple quantum well layer.

In one embodiment of the present disclosure, the multiple quantum well layer is made of InGaAsP.

In one embodiment of the present disclosure, the method further comprises: removing the $SiO_2$ patterned layer after performing the rapid thermal annealing treatment.

To achieve the above object, the present disclosure provides a method for fabricating a waveguide construction, comprising steps of: providing a layered structure by: forming a first-type semiconductor material layer on a substrate; forming an active layer containing gallium on the first-type semiconductor material layer; and forming a second-type semiconductor material layer containing gallium on the active layer; forming an $SiO_2$ patterned layer on the second-type semiconductor material layer, wherein the $SiO_2$ patterned layer comprises a plurality of $SiO_2$ regions, and at least one channel towards a desired direction is formed between the $SiO_2$ regions; and performing a rapid thermal annealing treatment on the layered structure having the $SiO_2$ patterned layer, wherein the rapid thermal annealing treatment has a treating temperature ranged from 720° C. to 760° C., and a treating time ranged from 60 seconds to 240 seconds.

In one embodiment of the present disclosure, the channel is linear.

In one embodiment of the present disclosure, an inner width of the channel is between 3 and 7 um.

In one embodiment of the present disclosure, the rapid thermal annealing treatment has the treating temperature of 740° C. and the treating time ranged from 90 seconds to 180 seconds.

In one embodiment of the present disclosure, a number of the channels is equal to or greater than two, and all of the channels are towards the desired direction.

In one embodiment of the present disclosure, the first-type semiconductor material layer is an N-type semiconductor material layer and the second-type semiconductor material layer is a P-type semiconductor material layer.

In one embodiment of the present disclosure, the active layer is a multiple quantum well layer.

In one embodiment of the present disclosure, the multiple quantum well layer is made of InGaAsP.

In one embodiment of the present disclosure, the method further comprises: removing the $SiO_2$ patterned layer after performing the rapid thermal annealing treatment.

DETAILED DESCRIPTION OF THE PREFERRED EMBODIMENTS

The structure and the technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

Figure 1:
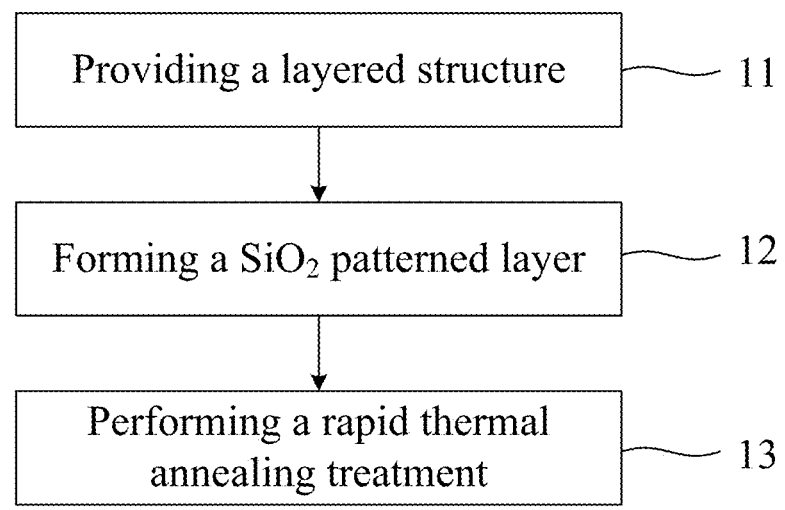
FIG. 1 is a flow chart of a method for fabricating a waveguide construction according to an embodiment of the present disclosure.
Figure 2:
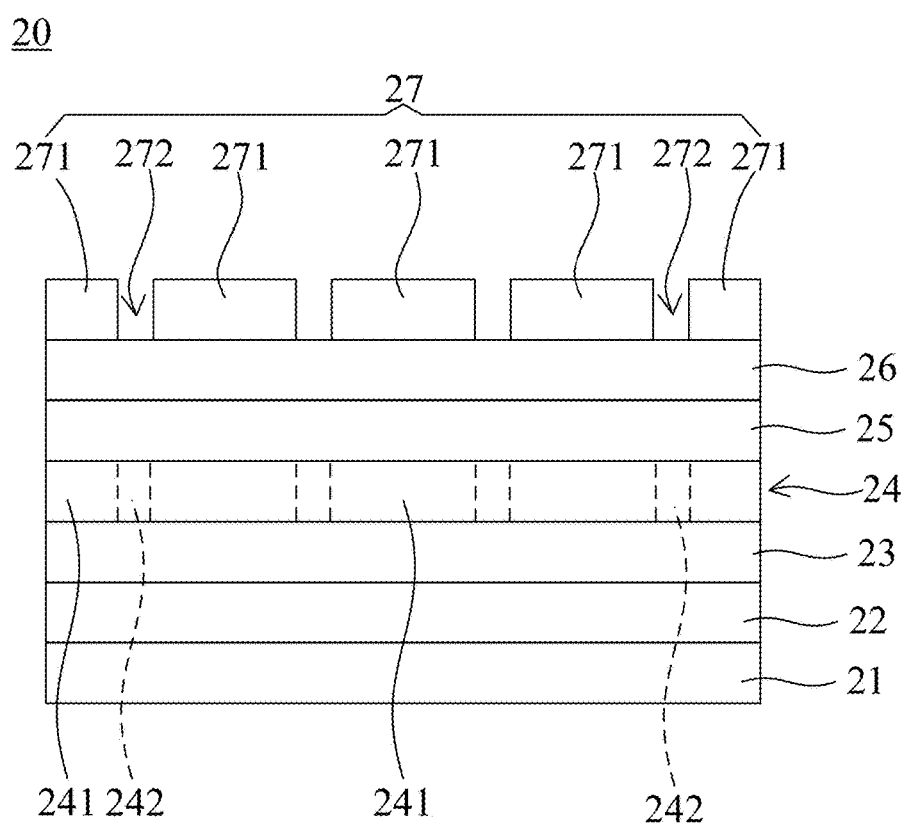
FIG. 2 is a cross-sectional diagram of a waveguide construction fabricated by the method according to an embodiment of the present disclosure.

Please refer to FIG. 1 together with FIG. 2. FIG. 1 is a flow chart of a method 10 for fabricating a waveguide construction according to an embodiment of the present disclosure; and FIG. 2 is a cross-sectional diagram of a waveguide construction 20 fabricated by the method 10 according to an embodiment of the present disclosure. In one embodiment of the present disclosure, a method 10 for fabricating a waveguide construction mainly comprises steps 11 to 13 of: providing a layered structure (step 11) by: forming a first-type InGaAsP layer 22 on a substrate 21; forming a first-type InP layer 23 on the first-type InGaAsP layer 22; forming an active layer 24 containing gallium on the first-type InP layer 23; forming a second-type InP layer 25 on the active layer 24; and forming a second-type InGaAsP layer 26 on the second-type InP layer 25; forming an $SiO_2$ patterned layer 27 on the second-type InGaAsP layer 26, wherein the $SiO_2$ patterned layer 27 comprises a plurality of $SiO_2$ regions 271, and at least one channel 272 facing toward a desired direction (such as being perpendicular to a paper surface in FIG. 2) is formed between the $SiO_2$ regions (step 12); and performing a rapid thermal annealing treatment on the layered structure having the $SiO_2$ patterned layer 27, wherein the rapid thermal annealing treatment has a treating temperature ranged from 720° C. to 760° C. and a treating time ranged from 60 seconds to 240 seconds (step 13). The details and the principles of each of the above steps will be described in detail below.

Please continue to refer FIGS. 1 and 2. At first, the method 10 for fabricating the waveguide construction comprises the step 11 of: providing a layered structure by: forming a first-type InGaAsP layer 22 on a substrate 21; forming a first-type InP layer 23 on the first-type InGaAsP layer 22; forming an active layer 24 containing gallium on the first-type InP layer 23; forming a second-type InP layer 25 on the active layer 24; and forming a second-type InGaAsP layer 26 on the second-type InP layer 25. In the step 11, a layered structure is mainly provided. The layered structure can be formed by using a semiconductor production method. For example, each of the layers in step 11 can be formed on the substrate 21 in sequence by coating, physical vapor deposition (PVD), chemical vapor deposition (CVD), sputtering, etc. In principle, the layered structure of the present embodiment belongs to a series of semiconductor materials of the InP/InGaAsP, but other series of semiconductor materials may be taken into account, such as AlGaAs/GaAs, AlGaInP/InGaP/GaAs, InGaN/GaN or AlGaInAs. More specifically, the layered structure can be formed by using the below method: forming a first-type semiconductor material layer on a substrate; forming an active layer containing gallium on the first-type semiconductor material layer; and forming a second-type semiconductor material layer containing gallium on the active layer.

In one embodiment, the first-type InGaAsP layer 22 is an N-type InGaAsP layer, the first-type InP layer 23 is an N-type InP layer, the second-type InP layer 25 is a P-type InP layer, and the second-type InGaAsP layer 26 is a P-type InGaAsP layer. In another embodiment, the first-type InGaAsP layer 22 is a P-type InGaAsP layer, the first-type InP layer 23 is a P-type InP layer, the second-type InP layer 25 is an N-type InP layer, and the second-type InGaAsP layer 26 is an N-type InGaAsP layer. In one embodiment, the active layer 24 is a multiple quantum well layer, consisting of InGaAsP. In another embodiment, the active layer 24 can produce a light.

In one embodiment, a thickness of the first-type InGaAsP layer 22 may be not limited to a specific value; a thickness of the first-type InP layer 23 may be not limited to a specific value; a thickness of the active layer 24 can be ranged from 30 nm to 300 nm; a thickness of the second-type InP layer 25 can be ranged from 100 nm to 3000 nm; and a thickness of second-type InGaAsP layer 26 can be ranged from 50 nm to 400 nm.

After the step 11, the method 10 for fabricating the waveguide construction comprises the step 12 of: forming a $SiO_2$ patterned layer 27 on the second-type InGaAsP layer 26, wherein the $SiO_2$ patterned layer 27 comprises a plurality of SiO$_2$ regions 271, and at least one channel 272 facing toward a desired direction is formed between the SiO$_2$ regions. In step 12, the SiO$_2$ patterned layer 27 is formed by using PVD, CVD, sputtering, etc. In one embodiment, a thickness of the SiO$_2$ patterned layer 27 is ranged from 100 nm to 400 nm. In another embodiment, the channel 272 is linear. For example, an inner width of the channel is between 3 and 7 um, such as 4 um, 5 um, or 6 um. In another embodiment, a number of the channel 272 can be equal to or greater than two, such as three, four, five or seven, and all of the channels are towards the desired direction.

On the other hand, a position of the channel 272 would correspond to a position of at least one guiding channel 242 formed in the active layer in the following step. More specifically, the SiO$_2$ regions 271 of the SiO$_2$ pattern layer 27 will have an effect on the active layer 24 in the following step 13 such that a refractive index of the active layer 24 located directly below the SiO$_2$ regions 271 (referred to as an intermixing region 241) is lowered (which is used as a low refractive index portion), and a refractive index of the active layer 24 directly below the channel 272 remains constant (which is used as a high refractive index portion, i.e., a guiding channel 242). Therefore, the active layer 24 has two different refractive indices without being subjected to etching (or without breaking the structure).

After the step 12, the method 10 for fabricating the waveguide construction comprises the step 13 of: performing a rapid thermal annealing treatment on the layered structure having the SiO$_2$ patterned layer 27, wherein the rapid thermal annealing treatment has a treating temperature ranged from 720° C. to 760° C. and a treating time ranged from 60 seconds to 240 seconds. In one embodiment, the treating temperature is 746° C., and the treating time is 180 seconds. As described above, the rapid thermal annealing treatment can enable SiO$_2$ (silicon oxides) contained in the SiO$_2$ patterned layer 27 to bond to Ga contained in the second-type InGaAsP layer 27, so as to form a plurality of holes in the second-type InGaAsP layer 27 corresponding to a position located directly below the channel 272. Further, the holes would diffuse into the second-type InGaAsP layer 25 and the active layer 24 correspondingly. When the holes diffuse into the active layer 24, the reflective index of the active layer 24 with the holes (i.e. a location of the guiding channel 242) would decrease, and the reflective index of the active layer 24 without the holes keeps constant. In other words, the active layer 24 may have two regions of different refractive indices in a state where the structure of the active layer 24 is not destroyed.

In one embodiment, the SiO$_2$ patterned layer can be removed after performing the step 13 of the rapid thermal annealing treatment.

Figure 3A:
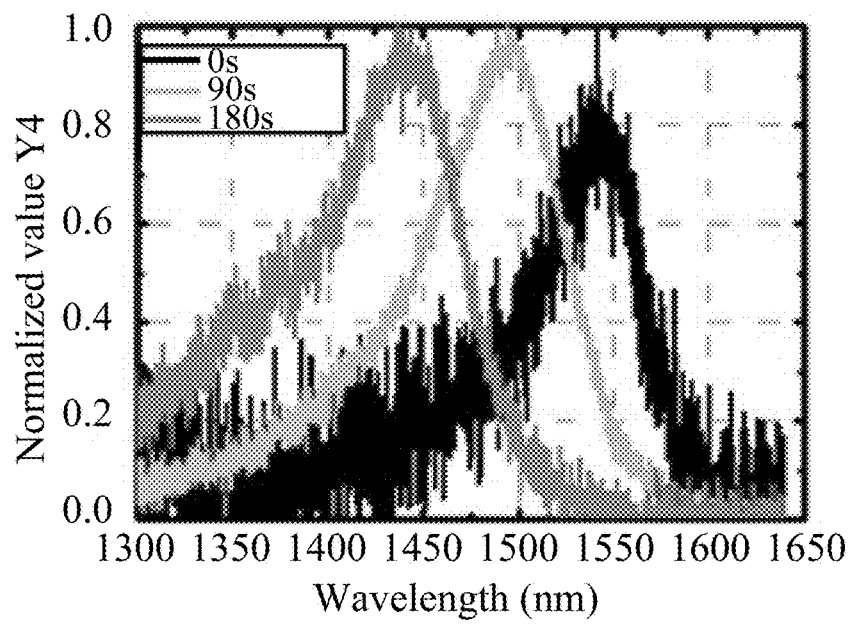
FIG. 3A is an experimental data diagram that a wavelength of a light wave can be emitted from an intermixing region, after performing a rapid thermal annealing treatment at 740° C. for 0 s, 90 s, and 180 s.
Figure 3B:
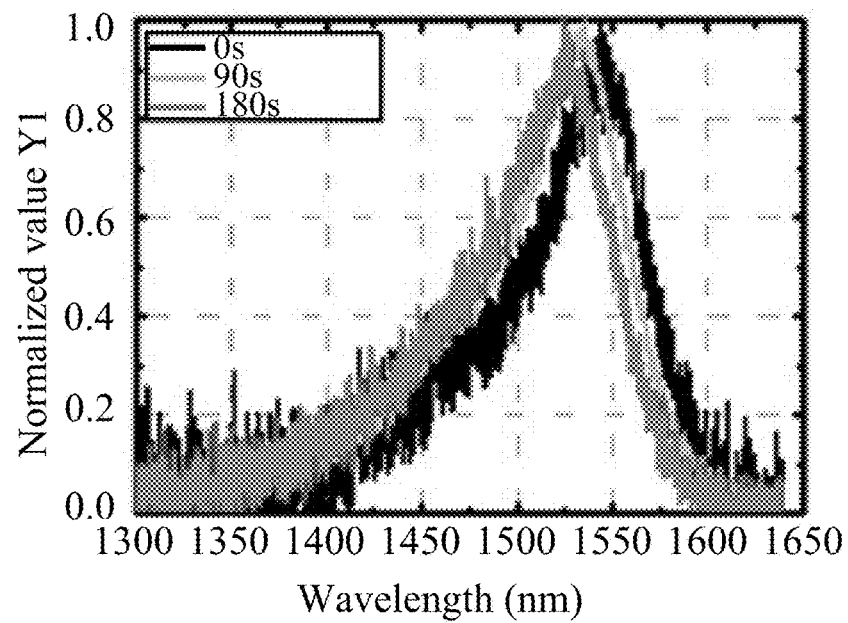
FIG. 3B is an experimental data diagram that a wavelength of a light wave can be emitted from a guiding channel, after performing a rapid thermal annealing treatment at 740° C. for 0 s, 90 s, and 180 s.

Please refer to FIGS. 3A and 3B. FIG. 3A is an experimental data diagram that a wavelength of a light wave which can be emitted from an intermixing region 241, after performing a rapid thermal annealing treatment for 0 s, 90 s, and 180 s, FIG. 3B is an experimental data diagram that a wavelength of a light wave can be emitted from a guiding channel 242, after performing a rapid thermal annealing treatment at 740° C. for 0 s, 90 s, and 180 s. From FIGS. 3A and 3B, after performing the rapid thermal annealing treatment for 90 s and 180 s, a wave length of the light of the intermixing region 241 has a displacement. For example, when the rapid thermal annealing treatment is performed for 0 s (i.e. the rapid thermal annealing treatment is not performed yet), a wavelength peak is 1541 nm; when the rapid thermal annealing treatment is performed for 90 s, the wavelength peak is moved to 1494 nm; and when the rapid thermal annealing treatment is performed for 180 s, the wavelength peak is moved to 1436 nm. On the other hand, the wavelength of the light wave that can be emitted by the guiding channel 242 is not significantly changed at each treating temperature. From the displacement of these wavelength peaks, it is known that an energy band of the guiding channel 242 is widened so that the wavelength peak of the omitted light is shifted, and the refractive index of the intermixing region 241 is lowered (for example, by about 0.07).

Figure 4A:
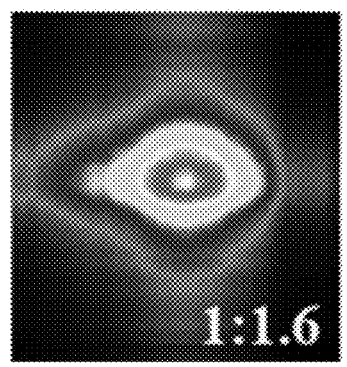
FIG. 4A to FIG. 4C are near-field energy distribution diagrams of a light which is transmitted after passing through the waveguide construction fabricated by each of the embodiments of the present disclosure.
Figure 4B:
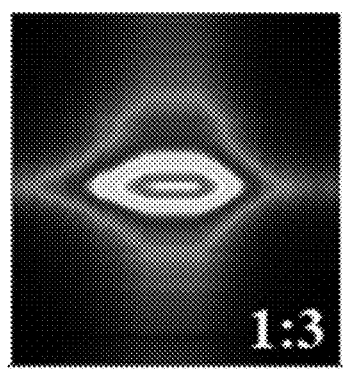
Figure 4C:
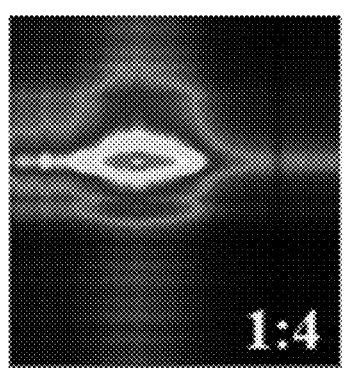
Figure 4D:
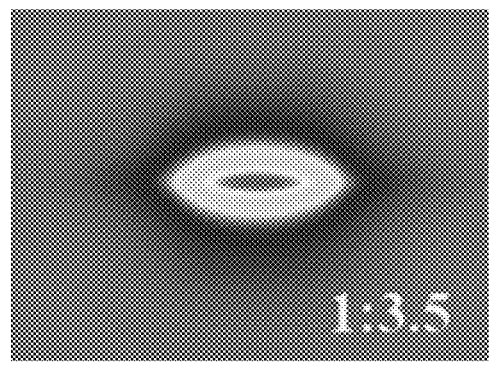
FIG. 4D to FIG. 4F are simulated near-field energy distribution diagrams of a simulated light is transmitted after passing through the waveguide construction fabricated by each of the embodiments of the present disclosure.
Figure 4E:
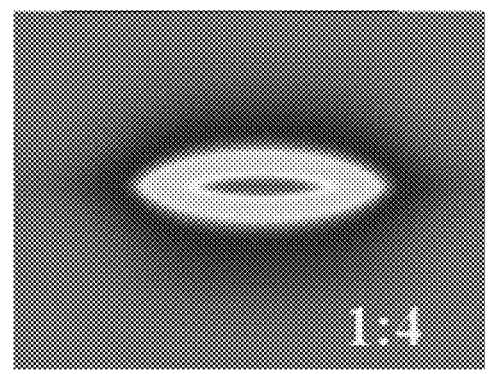
Figure 4F:
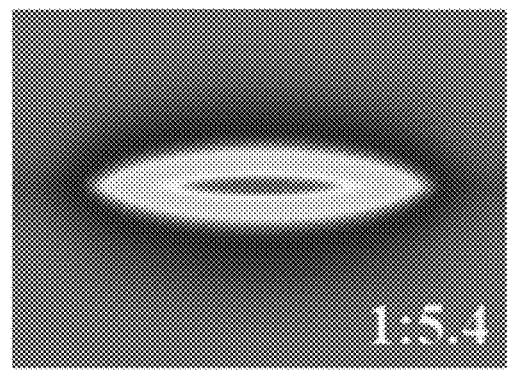

Please refer to FIGS. 4A to 4F. FIG. 4A to FIG. 4C are near-field energy distribution diagrams of a light is transmitted after passing through the waveguide construction 20 fabricated by each of the embodiments of the present disclosure, wherein a channel of 3 um is used in the embodiment of FIG. 4A, a channel of 5 um is used in the embodiment of FIG. 4B, and a channel of 7 um is used in the embodiment of FIG. 4C. FIG. 4D to FIG. 4F are simulated near-field energy distribution diagrams of a simulated light is transmitted after passing through the waveguide construction fabricated by each of the embodiments of the present disclosure. From FIGS. 4A to 4F, the actual measurement results are similar to the simulating results, and thus the waveguide structure 20 fabricated by the embodiments of the present disclosure indeed has the above-mentioned effects.

Figure 5A:
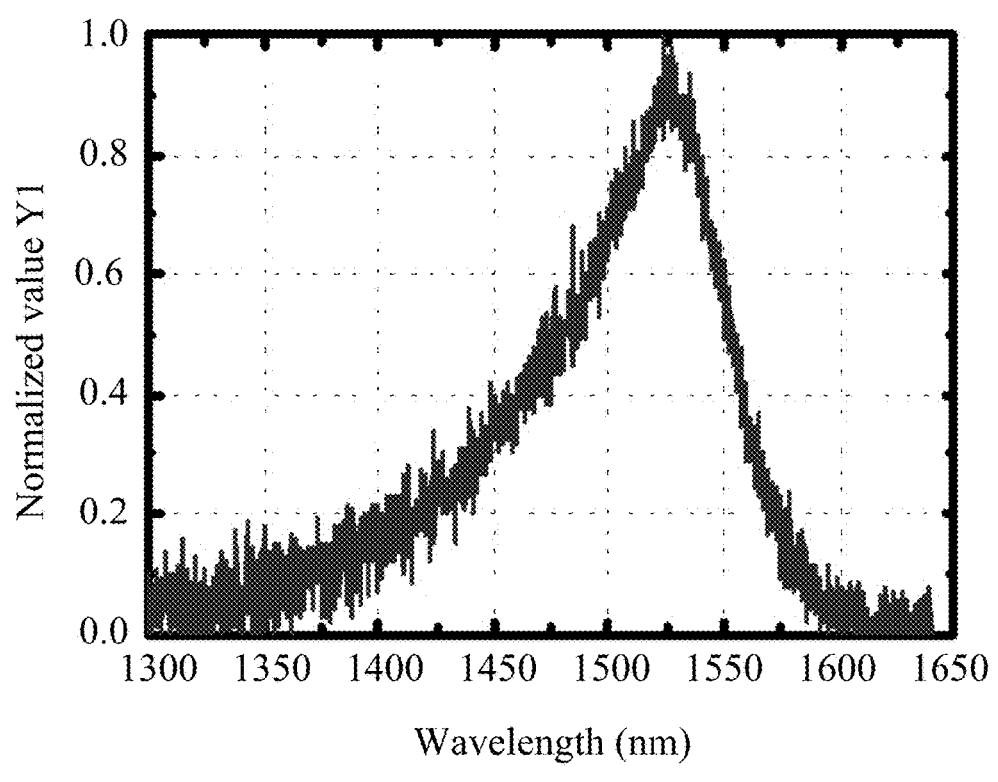
FIG. 5A is a photoluminescence spectrum diagram of the intermixing region.
Figure 5B:
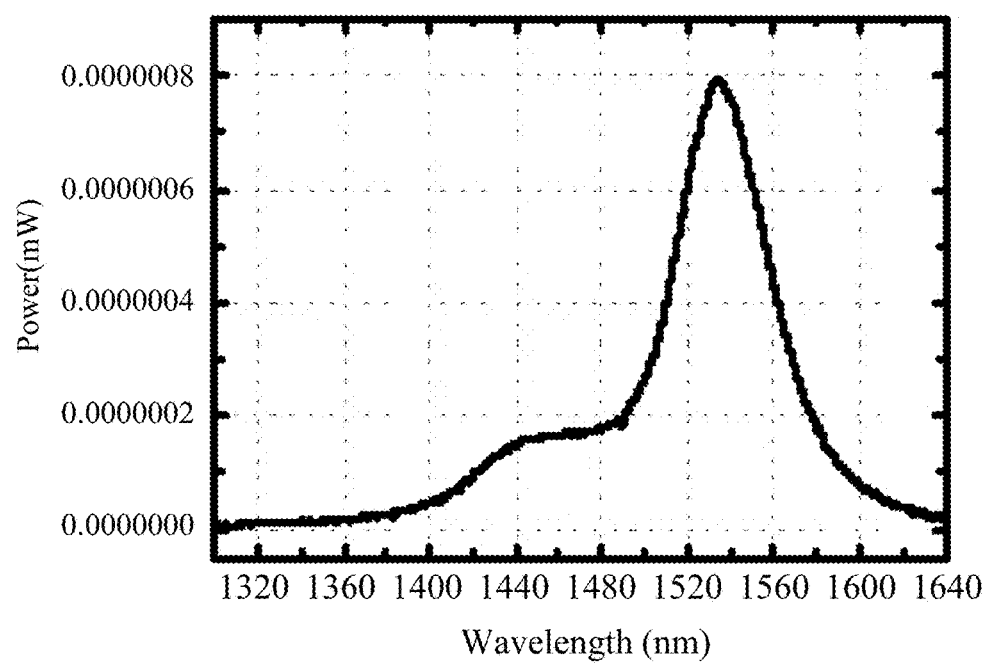
FIG. 5B is an electroluminescence spectrum diagram of the guiding channel with an inner width of 7 microns.

Please refer to FIGS. 5A and 5B. FIG. 5A is a photoluminescence (PL) spectrum diagram of the intermixing region 241. FIG. 5B is an electroluminescence (EL) spectrum diagram of the guiding channel with an inner width of 7 microns. From FIGS. 5A and 5B, it can be observed that the intermixing region 241 has a peak value of 1525 nm in the PL spectrum and the guiding channel 242 has a peak value of 1530 nm in the EL spectrum. Therefore, the observed wavelengths are quite close to each other. Thus, the observed result can prove that the energy observed in FIG. 3C is derived from the light emitted by the guiding channel 242 as shown in FIG. 2, rather than the light from the intermixing region 241. Otherwise, there would be a more obvious wavelength shift phenomenon on the spectrum. Further, a current confinement capability of the waveguide construction also can be supported by FIGS. 4A and 4B. This is because the guiding channel 242 would also receive a current and excite carriers to produce a lower wavelength optical spectrum assuming that the current confinement is not strong.

From the above, a method for fabricating a waveguide construction is provided, in which an active layer with a guiding channel is fabricated without using an etching method, so as to enable the active layer of the waveguide construction having an intact structure. Further, a relatively low fabricating cost and a relatively low fabricating time are used. Furthermore, a method for fabricating a waveguide construction is provided, in which the active layer with the guiding channel is fabricated by using a quantum well intermixing (QWI) method, so as to enable the active layer of the waveguide construction having an intact structure. Further, a relatively low fabricating cost and a relatively low fabricating time are used.

The present disclosure has been described with a preferred embodiment thereof and it is understood that many changes and modifications to the described embodiment can be carried out without departing from the scope and the spirit of the disclosure that is intended to be limited only by the appended claims.

What is claimed is:

1. A method for fabricating a waveguide construction, comprising steps of:
   providing a layered structure by:
      forming a first-type InGaAsP layer on a substrate;
      forming a first-type InP layer on the first-type InGaAsP layer;
      forming an active layer containing gallium on the first-type InP layer;
      forming a second-type InP layer on the active layer; and
      forming a second-type InGaAsP layer on the second-type InP layer;
   forming an $SiO_2$ patterned layer on the second-type InGaAsP layer, wherein the $SiO_2$ patterned layer comprises a plurality of $SiO_2$ regions, and at least one channel facing toward a desired direction is formed between the $SiO_2$ regions; and
   performing a rapid thermal annealing treatment on the layered structure having the $SiO_2$ patterned layer, wherein the rapid thermal annealing treatment has a treating temperature ranged from 720° C. to 760° C. and a treating time ranged from 60 seconds to 240 seconds.

2. The method for fabricating the waveguide construction according to claim 1, wherein the channel is linear.

3. The method for fabricating the waveguide construction according to claim 1, wherein an inner width of the channel is between 3 and 7 um.

4. The method for fabricating the waveguide construction according to claim 1, wherein the rapid thermal annealing treatment has a treating temperature of 740° C., and a treating time ranged from 90 seconds to 180 seconds.

5. The method for fabricating the waveguide construction according to claim 1, wherein a number of the channels is equal to or greater than two, and all of the channels are towards the desired direction.

6. The method for fabricating the waveguide construction according to claim 1, wherein the first-type InGaAsP layer is an N-type InGaAsP layer, the first-type InP layer is an N-type InP layer, the second-type InP layer is a P-type InP layer, and the second-type InGaAsP layer is a P-type InGaAsP layer.

7. The method for fabricating the waveguide construction according to claim 1, wherein the active layer is a multiple quantum well layer.

8. The method for fabricating the waveguide construction according to claim 7, wherein the multiple quantum well layer is made of InGaAsP.

9. The method for fabricating the waveguide construction according to claim 1, further comprising: removing the $SiO_2$ patterned layer after performing the rapid thermal annealing treatment.

10. A method for fabricating a waveguide construction, comprising steps of:
    providing a layered structure by:
       forming a first-type semiconductor material layer on a substrate;
       forming an active layer containing gallium on the first-type semiconductor material layer; and
       forming a second-type semiconductor material layer containing gallium on the active layer;
    forming an $SiO_2$ patterned layer on the second-type semiconductor material layer, wherein the $SiO_2$ patterned layer comprises a plurality of $SiO_2$ regions, and at least one channel towards a desired direction is formed between the $SiO_2$ regions; and
    performing a rapid thermal annealing treatment on the layered structure having the $SiO_2$ patterned layer, wherein the rapid thermal annealing treatment has a treating temperature ranged from 720° C. to 760° C., and a treating time ranged from 60 seconds to 240 seconds.

11. The method for fabricating the waveguide construction according to claim 10, wherein the channel is linear.

12. The method for fabricating the waveguide construction according to claim 10, wherein an inner width of the channel is between 3 and 7 um.

13. The method for fabricating the waveguide construction according to claim 10, wherein the rapid thermal annealing treatment has a treating temperature of 740° C. and a treating time ranged from 90 seconds to 180 seconds.

14. The method for fabricating the waveguide construction according to claim 10, wherein a number of the channels is equal to or greater than two, and all of the channels are towards the desired direction.

15. The method for fabricating the waveguide construction according to claim 10, wherein the first-type semiconductor material layer is an N-type semiconductor material layer and the second-type semiconductor material layer is a P-type semiconductor material layer.

16. The method for fabricating the waveguide construction according to claim 10, wherein the active layer is a multiple quantum well layer.

17. The method for fabricating the waveguide construction according to claim 16, wherein the multiple quantum well layer is made of InGaAsP.

18. The method for fabricating the waveguide construction according to claim 10, further comprising: removing the $SiO_2$ patterned layer after performing the rapid thermal annealing treatment.

* * * * *